United States Patent
Yasuda et al.

(10) Patent No.: US 9,425,801 B2
(45) Date of Patent: Aug. 23, 2016

(54) PROGRAMMABLE LOGIC CIRCUIT AND NONVOLATILE FPGA

(71) Applicant: KABUSHIKI KAISHA TOSHIBA, Tokyo (JP)

(72) Inventors: Shinichi Yasuda, Tokyo (JP); Kosuke Tatsumura, Kanagawa (JP); Mari Matsumoto, Kanagawa (JP); Masato Oda, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/691,641

(22) Filed: Apr. 21, 2015

(65) Prior Publication Data
US 2015/0311900 A1    Oct. 29, 2015

(30) Foreign Application Priority Data
Apr. 25, 2014   (JP) ................... 2014-091490

(51) Int. Cl.
*H03K 19/177*   (2006.01)
*H03K 19/173*   (2006.01)

(52) U.S. Cl.
CPC ...... *H03K 19/17748* (2013.01); *H03K 19/1778* (2013.01)

(58) Field of Classification Search
CPC ............... H03K 19/17736; H03K 19/018585; H03K 19/0948; H03K 19/177
USPC ................ 326/37–41, 47; 365/189.011, 231
See application file for complete search history.

(56) References Cited

U.S. PATENT DOCUMENTS

| | | | |
|---|---|---|---|
| 4,758,745 A | 7/1988 | Elgamal et al. | |
| 4,987,560 A * | 1/1991 | Hamano | G11C 8/10 365/200 |
| 5,200,652 A | 4/1993 | Lee | |
| 2006/0214261 A1 | 9/2006 | You et al. | |
| 2007/0159231 A1* | 7/2007 | Lin | G11C 17/18 327/525 |
| 2009/0224323 A1 | 9/2009 | Im et al. | |
| 2009/0323450 A1 | 12/2009 | Monreal | |
| 2015/0214950 A1* | 7/2015 | Yasuda | H03K 19/018585 326/41 |
| 2015/0348631 A1 | 12/2015 | Matsumoto et al. | |
| 2016/0079983 A1 | 3/2016 | Tatsumura et al. | |

FOREIGN PATENT DOCUMENTS

| | | |
|---|---|---|
| JP | 2006-216954 | 8/2006 |
| JP | 2011-527065 | 10/2011 |
| JP | 2015-018590 | 1/2015 |
| JP | 2015-142175 | 8/2015 |
| JP | 2015-230919 | 12/2015 |
| JP | 2016-63026 | 4/2016 |
| WO | WO 2015/0005149 | 1/2015 |

* cited by examiner

*Primary Examiner* — Jany Richardson
(74) *Attorney, Agent, or Firm* — Finnegan, Henderson, Farabow, Garrett & Dunner, LLP

(57) ABSTRACT

A programmable logic circuit according to an embodiment includes: a first programmable device with a first and second terminals, a resistance of the first programmable device being changeable from a high resistance to a low resistance; a second programmable device with a third and fourth terminals, a resistance of the second programmable device being changeable from a high resistance to a low resistance; a first wiring line to which the first terminal is connected; a second wiring line to which the third terminal is connected; a third wiring line to which the second terminal and the fourth terminal are connected; and a fuse element of which one terminal is connected to the third wiring line.

21 Claims, 16 Drawing Sheets

PROGRAMMABLE LOGIC CIRCUIT AND NONVOLATILE FPGA

CROSS REFERENCE TO RELATED APPLICATIONS

This application is based upon and claims the benefit of priority from prior Japanese Patent Application No. 2014-091490 filed on Apr. 25, 2014 in Japan, the entire contents of which are incorporated herein by reference.

FIELD

Embodiments described herein relate generally to programmable logic circuits and nonvolatile field programmable gate arrays (FPGAs).

Field programmable integrated circuits, notably field programmable gate arrays (FPGAs), have received attention in recent years. FPGAs realize basic logic data by means of logic blocks. Users can achieve desired logic functions by switching connections among logic blocks by switches. Configuration memories store logic data of the logic blocks and data of the switches for changing connections. Desired logic functions can be realized based on the stored data.

Nonvolatile FPGAs can be constituted by storing nonvolatile data in the configuration memories. Antifuse FPGAs including antifuse elements that are typical one-time elements are known as nonvolatile FPGAs. In an antifuse FPGA, an antifuse element serves as the switch connecting the logic blocks. Conventional antifuse FPGAs, however, needed a high voltage transistor in a circuit for selecting an antifuse element since a high voltage is required to program the antifuse element. High voltage transistors have a drawback of increasing the entire area of FPGAs since gate oxide films thereof are thick, and lengths of channels thereof are long.

DETAILED DESCRIPTION

A programmable logic circuit according to an embodiment includes: a first programmable device with a first terminal and a second terminal, a resistance of the first programmable device being changeable from a high resistance to a low resistance; a second programmable device with a third terminal and a fourth terminal, a resistance of the second programmable device being changeable from a high resistance to a low resistance; a first wiring line to which the first terminal of the first programmable device is connected; a second wiring line to which the third terminal of the second programmable device is connected; a third wiring line to which the second terminal of the first programmable device and the fourth terminal of the second programmable device are connected; and a fuse element of which one terminal is connected to the third wiring line.

Embodiments will now be explained with reference to the accompanying drawings.

First Embodiment

Figure 1:
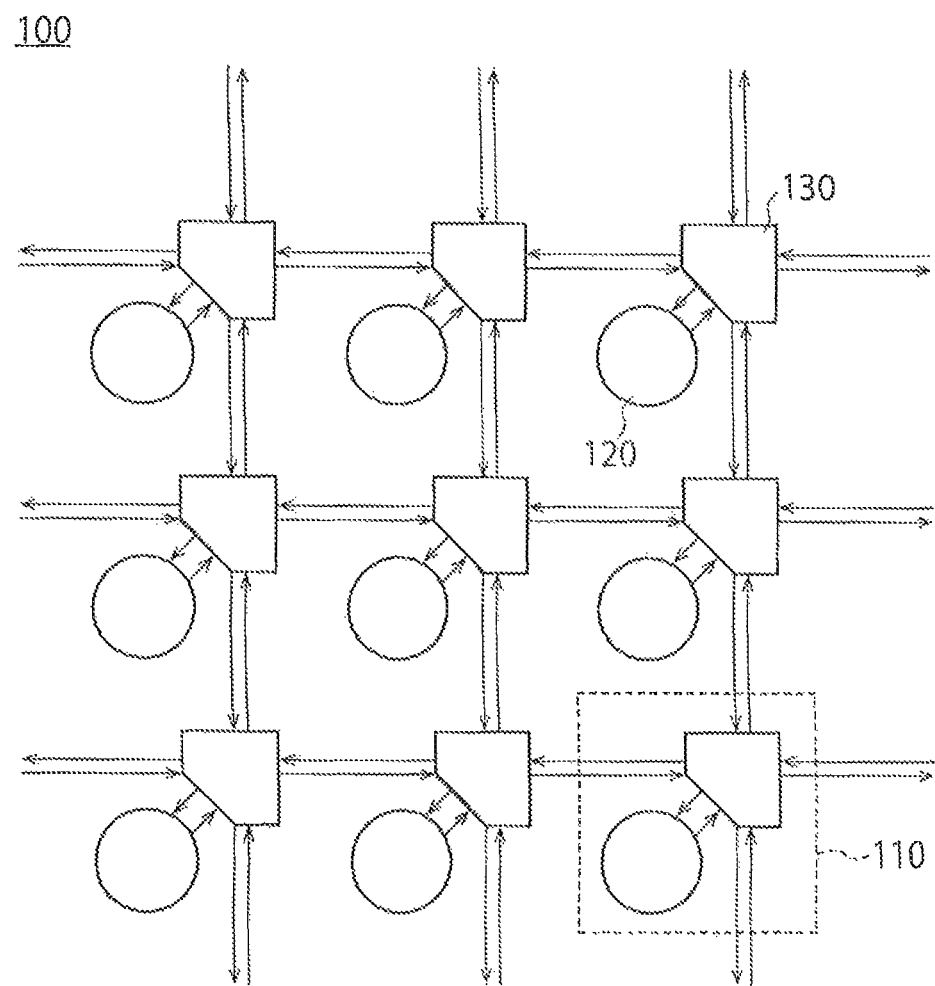
FIG. 1 is a diagram illustrating an example of an FPGA configuration.

Before a programmable logic circuit according to a first embodiment is described, a configuration of common FPGAs will be described. As shown in FIG. 1, an FPGA 100 generally includes a plurality of basic blocks 110 arranged in an array form. Each basic block 110 is connected to adjacent basic blocks 110 with wiring lines, and includes a logic block 120 and a switch block 130. The logic block 120 performs logical operations basically using a look-up table containing a truth table.

Each switch block 130 controls the connection and the disconnection of the wiring lines connecting to adjacent basic blocks 110 so that signals are transmitted to given directions. Each switch block 130 also connects to the logic block 120 included in the relevant basic block 110 including the switch block 130. The logic block 120 and the switch block 130 are capable of controlling the connection based on data stored in a configuration memory of the programmable logic circuit.

Figure 2:
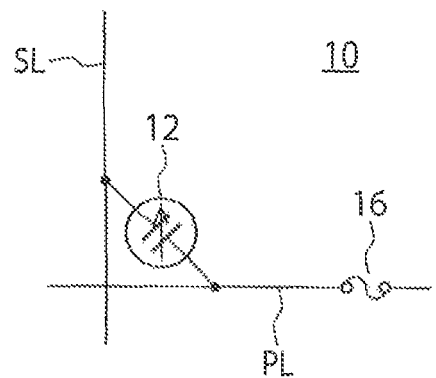
FIG. 2 is a circuit diagram illustrating a cell of a programmable logic circuit according to a first embodiment.

FIG. 2 shows a programmable logic circuit according to a first embodiment. The programmable logic circuit according to the first embodiment includes at least one source line SL, at least one program line PL crossing the source line SL, and a cell 10 disposed in an intersection region of the source line SL and the program line PL. The cell 10 includes a programmable device 12 with a first terminal connecting to the source line SL and a second terminal connecting to the program line PL, and a fuse element 16 with a first terminal connecting to the program line PL and a second terminal connecting to a power supply or write circuit (not shown).

Figure 3A:
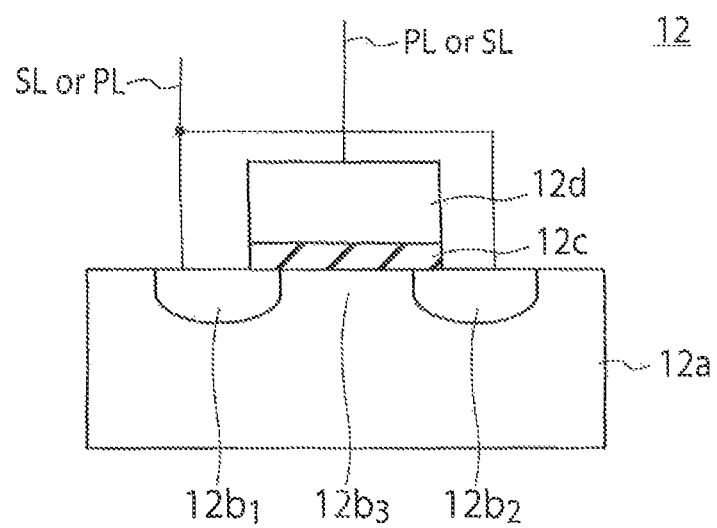
FIG. 3A is a cross-sectional view showing a first specific example of a programmable device in each cell.

FIG. 3A shows a first specific example of the programmable device 12, which is a metal-oxide-semiconductor (MOS) transistor. This MOS transistor includes a source $12b_1$ and a drain $12b_2$ that are separated from each other in a semiconductor layer 12a, a gate insulating film 12c disposed on a portion of the semiconductor layer 12a between the source 12b, and the drain $12b_2$, which will serve as a channel $12b_3$, and a gate electrode 12d disposed on the gate insulating film 12c. The gate insulating film 12c and the gate electrode 12d overlap portions of the source $12b_1$ and the drain $12b_2$ if viewed from above the gate electrode 12d. In other words, the portions of the source $12b_1$ and the drain $12b_2$ extend to a portion of the semiconductor layer 12a that will serve as the channel $12b_3$ located immediately below the gate insulating film 12c. The gate electrode 12d connects to one of the program line PL and the source line SL, and the source $12b_1$ and the drain $12b_2$ connect to the other.

A conductive path is formed between the source $12b_1$ and the drain $12b_2$ via the gate insulating film 12c and the gate electrode 12d in the programmable device 12 if breakdown of the gate insulating film 12c is caused by a program voltage Vprg applied between the gate electrode 12d and the source $12b_1$, and between the gate electrode 12d and the drain $12b_2$. This forms conductive paths between the gate electrode 12d and the source $12b_1$, and between the gate electrode 12d and the drain $12b_2$. If the breakdown of the gate insulating film does not occur, no conductive path is formed among the gate electrode 12d, the source $12b_1$, and the drain $12b_2$. This means that the programmable device 12 disposed in the intersection region between the program line PL and the source line SL is not conductive in the initial state due to the presence of the gate insulating film, and becomes conductive after the programming since the breakdown of the gate insulating film occurs.

If the programmable device 12 is a MOS transistor, the breakdown is preferably caused at the overlapping regions between the gate electrode 12d and the source $12b_1$ and between the gate electrode 12d and the drain $12b_2$ rather than between the gate electrode 12d and the semiconductor layer 12a. Breakdown of the gate insulating film between the gate electrode 12d and the semiconductor layer 12a may lead to connection with other programmable device, which is also subjected to breakdown of the gate insulating film, via the semiconductor layer (substrate). Avoiding this may require a well region provided to each programmable device in order to separate the programmable device from the other programmable devices, and therefore may require an increase in area. This problem may be overcome if the breakdown occurs in the overlapping regions between the gate electrode 12d and the source $12b_1$ and between the gate electrode 12d and the drain $12b_2$. The area of the programmable device 12, i.e., the area of the programmable logic circuit, and the entire area of the FPGA including such programmable logic circuits may be reduced in this manner.

Figure 3B:
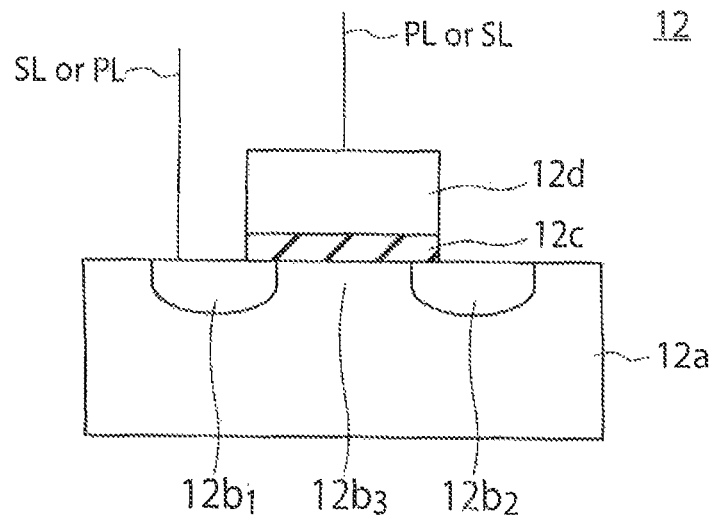
FIG. 3B is a cross-sectional view showing a second specific example of a programmable device in each cell.

FIG. 3B shows a second specific example of the programmable device 12, which is a MOS transistor. This MOS transistor Includes a source $12b_1$ and a drain $12b_2$ that are separated from each other in a semiconductor layer 12a, a gate insulating film 12c disposed on a portion of the semiconductor layer 12a between the source $12b_1$ and the drain $12b_2$, which will serve as a channel $12b_3$, and a gate electrode 12d disposed on the gate insulating film 12c. The gate insulating film 12c and the gate electrode 12d overlap at least portion of the source $12b_1$ if viewed from above the gate electrode 12d. In other words, at least the portion of the source $12b_1$ extend to a portion of the semiconductor layer 12a that will serve as the channel $12b_3$ located immediately below the gate insulating film 12c. The gate electrode 12d connects to one of the program line PL and the source line SL, and the source $12b_1$ connects to the other.

A conductive path is formed between the source $12b_1$ and the gate electrode 12d via the gate insulating film 12c in the programmable device 12 if breakdown of the gate insulating film 12c is caused by a program voltage Vprg applied between the gate electrode 12d and the source $12b_1$.

Figure 3C:
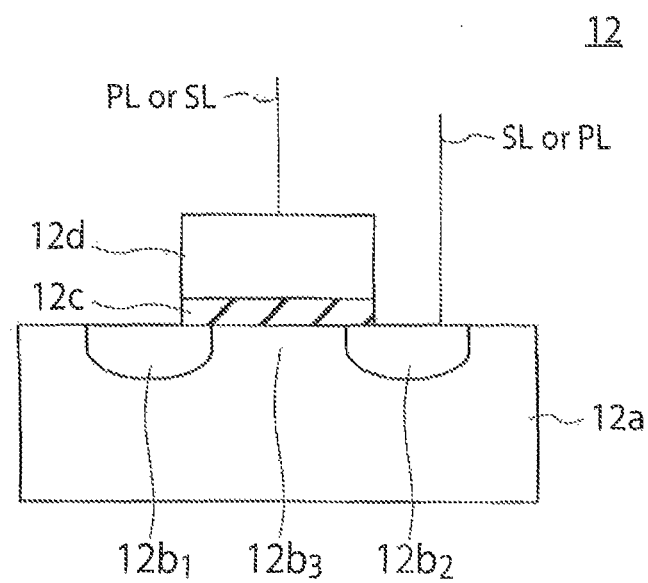
FIG. 3C is a cross-sectional view showing a third specific example of a programmable device in each cell.

FIG. 3C shows a third specific example of the programmable device 12, which is a MOS transistor. This MOS transistor includes a source $12b_1$ and a drain $12b_2$ that are separated from each other in a semiconductor layer 12a, a gate insulating film 12c disposed on a portion of the semiconductor layer 12a between the source $12b_1$ and the drain $12b_2$, which will serve as a channel $12b_3$, and a gate electrode 12d disposed on the gate insulating film 12c. The gate insulating film 12c and the gate electrode 12d overlap at least portion of the drain $12b_2$ if viewed from above the gate electrode 12d. In other words, at least the portion of the drain $12b_2$ extend to a portion of the semiconductor layer 12a that will serve as the channel $12b_3$ located immediately below the gate insulating film 12c. The gate electrode 12d connects to one of the program line PL and the source line SL, and the drain $12b_2$ connects to the other.

A conductive path is formed between the drain $12b_2$ and the gate electrode 12d via the gate insulating film 12c in the programmable device 12 if breakdown of the gate insulating film 12c is caused by a program voltage Vprg applied between the gate electrode 12d and the drain $12b_2$.

Figure 4A:
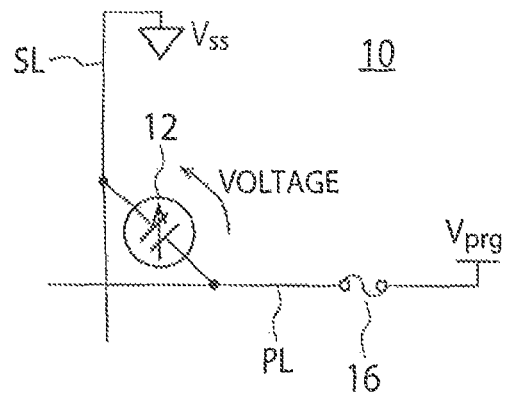
FIGS. 4A to 4C are explanatory circuit diagrams illustrating operations of cells.

The operations of the cells in the programmable logic circuit according to the first embodiment will be described with reference to FIGS. 4A to 4C. FIG. 4A shows that a program voltage Vprg is applied to the second terminal that is different from the first terminal connecting to the program line PL of the fuse element 16 and a voltage Vss that is lower than the program voltage Vprg is applied to the source line SL in the initial state of the cell 10. The program voltage Vprg may be applied to the source line SL, and the voltage Vss may be applied to the second terminal of the fuse element 16.

Since the fuse element 16 is conductive in FIG. 4A, a voltage obtained by subtracting the voltage Vss from the program voltage Vprg (Vprg–Vss) is applied across the programmable device 12. This voltage (Vprg–Vss) programs the programmable device 12 to make it conductive.

Figure 4B:
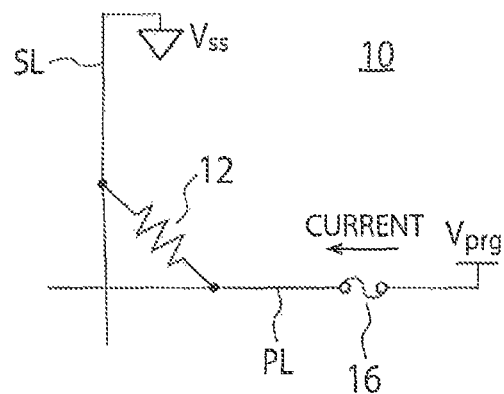

FIG. 4B shows that the programmable device 12, which is now conductive, serves as a resistor. A current flows in this state since both the fuse element 16 and the programmable device 12 are conductive. The current programs the fuse element 16 to make it nonconductive.

Figure 4C:
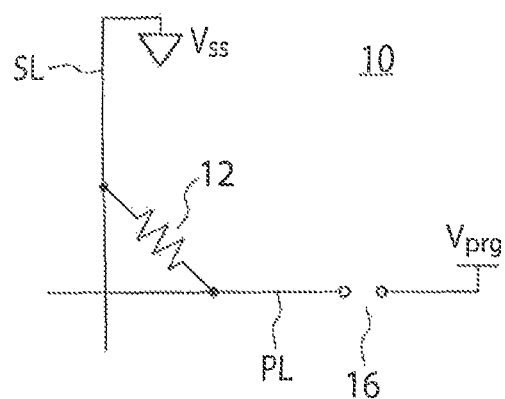

FIG. 4C shows the final state, in which the fuse element 16 is nonconductive, and the programmable device 12 is conductive. The programing operation ends in this state.

Figure 5A:
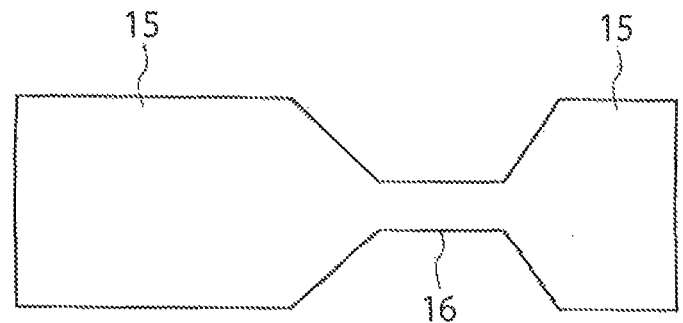
FIGS. 5A and 5B are diagrams illustrating a first specific example and a second specific example of fuse elements.

The fuse element 16 will further be described with reference to FIGS. 5A to 6B. FIG. 5A is a plan view of a first specific example of the fuse element 16. The first specific example of the fuse element 16 is obtained by narrowing a portion of the wiring line 15. The narrowed portion 16 increases the current density, causes electromigration to blow out (break) the wiring line 15, and make the fuse element 16 nonconductive. The wiring line may be formed by metal or poly silicon.

Figure 5B:
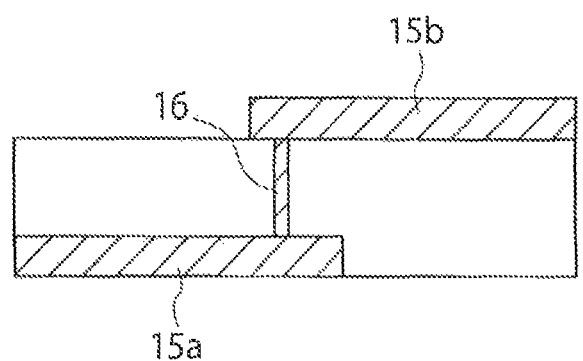

FIG. 5B is a cross-sectional view showing a second specific example of the fuse element 16. The fuse element 16 according to the second specific example is a via connecting a wiring line 15a and a wiring line 15b. Decreasing the size (diameter) of the via 16 increases the current density in the via 16 to cause electromigration as in the case of the first specific example. This makes the wiring lines 15a and 15b nonconductive.

Figure 6A:
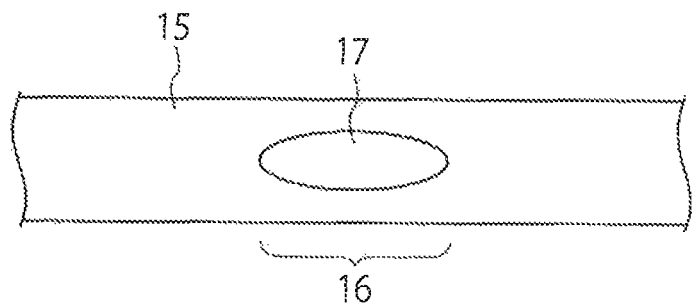
FIGS. 6A and 6B are diagrams illustrating a third specific example and a fourth specific examples of fuse elements.

FIG. 6A is a plan view showing a third specific example the fuse element 16. The fuse element 16 according to the third specific example includes a hole 17 that penetrates the wiring line 15 in the thickness direction. The hole 17 decreases the cross-sectional area of the wiring line 15 in a plane perpendicular to the direction along which the wiring line 15 extends. The first specific example of the fuse element 16 shown in FIG. 5A also decreases the cross-sectional area of the wiring line 15 in a plane perpendicular to the direction along which the wiring line 15 extends. Instead of decreasing the width of the wiring line as in the first specific example, the thickness of the wiring line 15 may be decreased to form the fuse element 16. This also decreases the cross-sectional area of the wiring line 15 in a plane perpendicular to the direction along which the wiring line 15 extends to form the fuse element 16. Advantages similar to those of the third specific example may be obtained by decreasing the cross-sectional area in a plane perpendicular to the direction along which the wiring line 15 extends to form the fuse element 16.

Figure 6B:
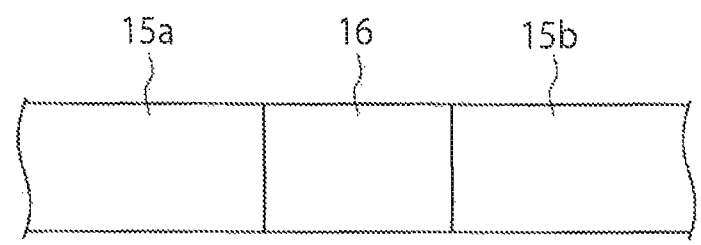

FIG. 6B is a plan view of a fourth specific example of the fuse element 16. The fourth specific example of the fuse element 16 may be disposed between a wiring line 15a and a wiring line 15b and is formed of a material with a lower melting point than a material of the wiring lines 15a, 15b. The width and the thickness of the fuse element 16 may be identical with those of the wiring lines 15a, 15b, or the width or the thickness may be less than that of the wiring lines 15a, 15b. Examples of the low melting point material used to form the fuse element 16 include SnSb, BiSn, SnAg, ZnAl, and InSn.

The mean time to failure MTF for the electromigration of the wiring lines can be expressed as follows:

$$MTF = AJ^{-n}\exp\left(\frac{E}{kT}\right)$$

where A and n are constants, J is the current density, E is the activation energy of the fuse element 16, T is the absolute temperature, and k is the Boltzmann constant. According to this expression, the wiring line width of the first specific example shown in FIG. 5A, for example, may be changed by $(10)^{1/n}$ in order to change the time by one order of magnitude required for electromigration in the wide portion of the wiring line and in the narrow portion. This allows electromigration to be caused more easily in the narrow portion in the wiring line. Although the value of n may vary depending on the respective processes, if the value of n is in a range from 1.5 to 2, for example, electromigration may be caused more easily in a narrow wiring line if the ratio between the width of the fuse element 16 and the width of the wiring line shown in FIGS. 5A and 5B is made about 1/4.6 to 1/3.2. Further, narrower width of the fuse element 16 compared with the width of the wiring line 15 may cause the electromigration more easily in the fuse element 16.

As described above, the fuse element may be formed by narrowing the wiring line or forming a via with a small diameter in the wiring line, and need not be formed in the area of the silicon substrate. This allows a reduction in the area of the programmable logic circuit, and further a reduction of the entire area of the FPGA, unlike the conventional cases where a high voltage transistor is used instead of the fuse element.
(Modification)

Figure 7:
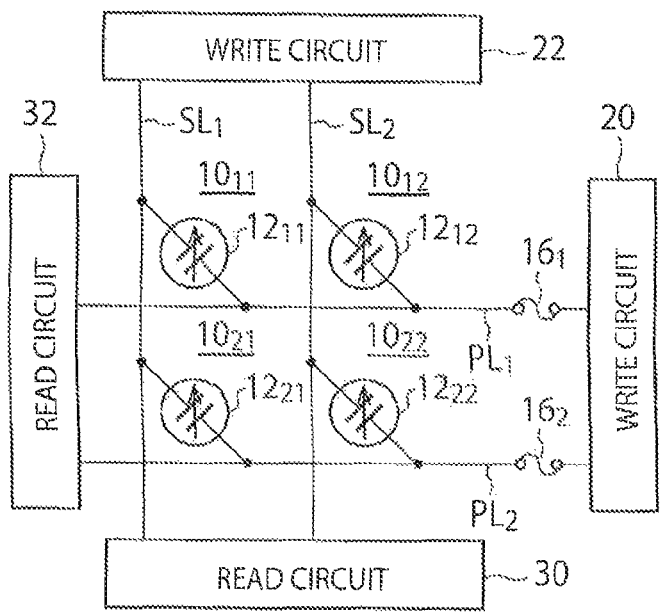
FIG. 7 is a circuit diagram illustrating a programmable logic circuit according to a first modification of the first embodiment.

FIG. 7 shows a programmable logic circuit according to a first modification of the first embodiment. The programmable logic circuit according to the first modification includes cells $10_{11}$-$10_{22}$ arranged in a 2×2 matrix form, program lines $PL_1$, $PL_2$, source lines $SL_1$, $SL_2$ crossing the program lines $PL_1$, $PL_2$, fuse elements $16_1$, $16_2$ corresponding to the program lines $PL_1$, $PL_2$, write circuits 20, 22, and read circuits 30, 32. Each cell $10_{ij}$ (i, j=1, 2) is disposed at an intersection region between a program line $PL_i$ and a source line $SL_j$. The cell $10_{ij}$ (i, j=1, 2) includes a programmable device $12_{ij}$ with a first terminal connecting to the source line $SL_j$ and a second terminal connecting to the program line $PL_i$, and a fuse element $16_i$ with a first terminal connecting to one terminal of the program line $PL_i$, and a second terminal connecting to the write circuit 20. The other terminal of the program line $PL_i$ connects to the read circuit 32. One terminal of the source line $SL_i$ (i=1, 2) connects to the write circuit 22, and the other connects to the read circuit 30.

Figure 8:
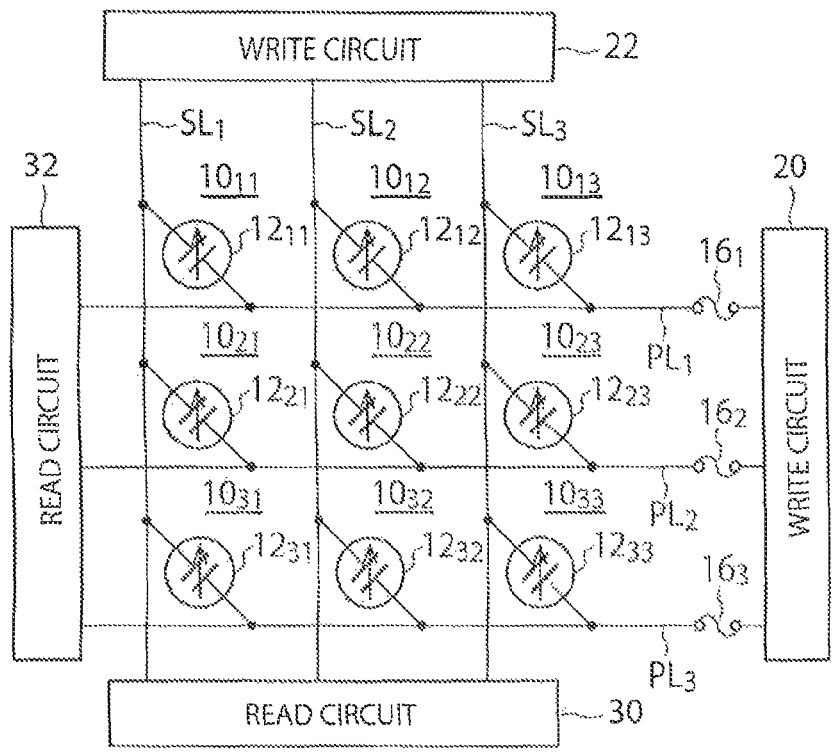
FIG. 8 is a circuit diagram illustrating a programmable logic circuit according to a second modification of the first embodiment.

FIG. 8 shows a programmable logic circuit according to a second modification of the first embodiment. The programmable logic circuit according to the second modification includes cells $10_{11}$-$10_{33}$ arranged in a 3×3 matrix form, program lines $PL_1$, $PL_2$, $PL_3$, source lines $SL_1$, $SL_2$, $SL_3$ crossing the program lines $PL_1$, $PL_2$, $PL_3$, fuse elements $16_1$, $16_2$, $16_3$ corresponding to the program lines $PL_1$, $PL_2$, $PL_3$, write circuits 20, 22, and read circuits 30, 32. Each cell $10_{ij}$ (i, j=1, 2, 3) is disposed at an intersection region between a program line $PL_i$ and a source line $SL_j$. The cell $10_{ij}$ (i, j=1, 2, 3) includes a programmable device $12_{ij}$ with a first terminal connecting to the source line $SL_j$ and a second terminal connecting to the program line $PL_i$, and a fuse element $16_i$ with a first terminal connecting to one terminal of the program line $PL_i$, and a second terminal connecting to the write circuit 20. The other terminal of the program line $PL_i$ connects to the read circuit 32. One terminal of the source line $SL_i$ (i=1, 2, 3) connects to the write circuit 22, and the other terminal connects to the read circuit 30.

The programming operations of the first modification and the second modification will be described below.

In a programming operation, a voltage Vprg−Vss is applied across the programmable device to be programmed, and a voltage less than Vprg−Vss is applied to the other programmable devices. For example, the programmable device $12_{11}$ of the cell $10_{11}$ in the first modification shown in FIG. 7 is programmed if the write circuit 20 and the write circuit 22 apply the program voltage Vprg to the program line $PL_1$, the voltage Vss to the source line $SL_1$, and a write inhibiting voltage Vinh meeting the condition Vprg>Vinh>Vss to the source line $SL_2$. The write circuit 20 also applies the write inhibiting voltage Vinh or voltage Vss to the program line $PL_2$, or let it to be in a floating state.

Since the fuse elements $16_1$, $16_2$ are one-time programmable elements, programming one of the programmable devices connecting to the same program line PL means inhibits the other programmable devices from being programmed. For example, programming the programmable device $12_{11}$ of the cell $10_{11}$ shown in FIG. 7 inhibits the programmable device $12_{12}$ connecting to the same program line $PL_1$ from being programmed. This characteristic allows stable programming of only one programmable device connecting to the same program line PL. In FPGAs including source lines SL as input lines and program lines PL as output lines, no signals in different source lines SL are outputted to the same program line PL. Therefore, the programmable logic circuits according to the first modification and the second modification of the first embodiment can be effectively employed in FPGAs.

In a read operation, the read circuits 30, 32 select one of the cells. The read circuit 30 applies a read voltage Vread to the source line SL connecting to the selected cell, and the read circuit 32 detects whether a current flows through the program line connecting to the selected cell. If this operation is applied to switch blocks and logic blocks of FPGAs, the read voltage Vread acts as a voltage Vdd corresponding to a High level of logic signals, the read circuit 30 serves as an input circuit, and the read circuit 32 serves as an output circuit. This configuration forms a signal switching circuit in which logic signals may pass through only the programmed cell $10_{ij}$.

As described above, according to the first embodiment and its modifications, programmable logic circuits and nonvolatile FPGAs can be provided, for which an increase in area can be prevented.

Second Embodiment

Figure 9:
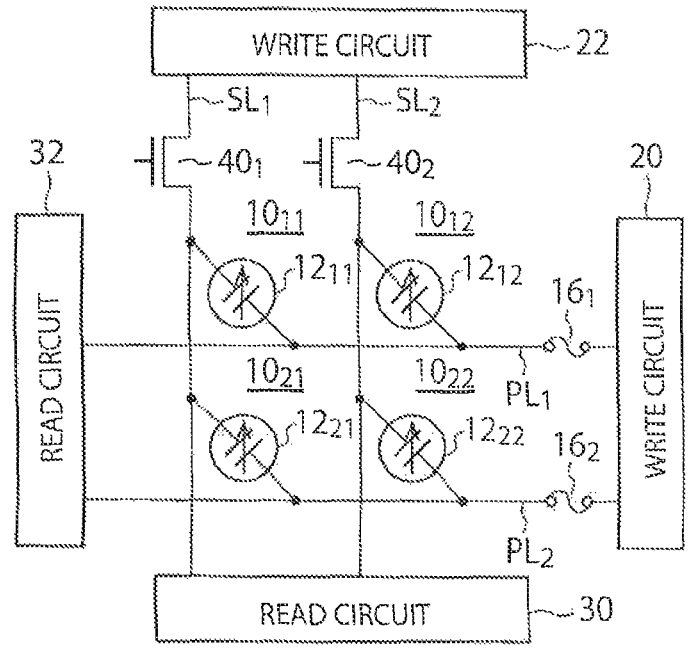
FIG. 9 is a circuit diagram illustrating a programmable logic circuit according to a second embodiment.

FIG. 9 shows a programmable logic circuit according to a second embodiment. The programmable logic circuit according to the second embodiment is obtained by disposing n-channel MOS transistors $40_1$, $40_2$ between the write circuit 22 and the source line $SL_1$, and between the write circuit 22 and the source line $SL_2$, respectively, in the programmable logic circuit according to the first modification of the first embodiment shown in FIG. 7. Instead of the n-channel MOS transistors $40_1$, $40_2$, p-channel MOS transistors may be disposed.

The programming operations in the programmable logic circuit according to the second embodiment will be described below.

In a programming operation, both the transistors $40_1$, $40_2$ are turned ON to apply the same voltages as those applied in the first modification shown in FIG. 7. Non-selected source lines SL may be left in a floating state. For example, if the programmable device $12_{11}$ in the cell $10_{11}$ is to be programmed, the transistor $40_1$ connecting to the source line $SL_1$ is turned ON to apply a program voltage Vprg to the program line $PL_1$, and a voltage Vss to the source line $SL_1$. The transistor $40_2$ connected to the non-selected source line $SL_2$ is turned OFF. As a result, the program voltage Vprg is applied to one terminal of the programmable device $12_{12}$, but the other terminal is left in a floating state. Therefore, no voltage is applied to the programmable device $12_{12}$ to prevent the programmable device $12_{12}$ from being programmed erroneously.

The voltage applied to the gate of the transistor $40_1$ to turn it ON is higher than the threshold voltage. This gate voltage has an effect on the resistance value of the programmable device $12_{11}$ after being programmed. For example, if the gate voltage is less than Vprg, the transistor $40_1$ after being programmed operates in a saturation state and the current flows therethrough is curbed. As a result, a current with a value similar to that of the current flowing through the transistor $40_1$ flows through the programmable device $12_{11}$, and the programming of the programmable device $12_{11}$ is complete. If the gate voltage is Vprg, the transistor $40_1$ after being programmed does not curb the current, and the resistance value of the programmable device $12_{11}$ is lowered. This allows controlling of the resistance value of the programmable device.

A write inhibiting voltage Vinh or voltage Vss is applied to the non-selected program line $PL_2$, or it is let to be in a floating state.

The read operation is performed in a similar manner to that for the first modification according to the first embodiment.

The programming operation for the second embodiment does not require application of a plurality of voltage values to the source lines SL. This allows simplification of the circuit configuration. In a FPGA, this circuit may be used to switch signals from the other terminals of the source lines SL to the program lines PL by turning OFF both of the transistors $40_1$, $40_2$.

As described above, the programmable logic circuit and the nonvolatile FPGA according to the second embodiment are capable of suppressing an increase in area, as in the case of the first modification of the first embodiment.

Third Embodiment

Figure 10:
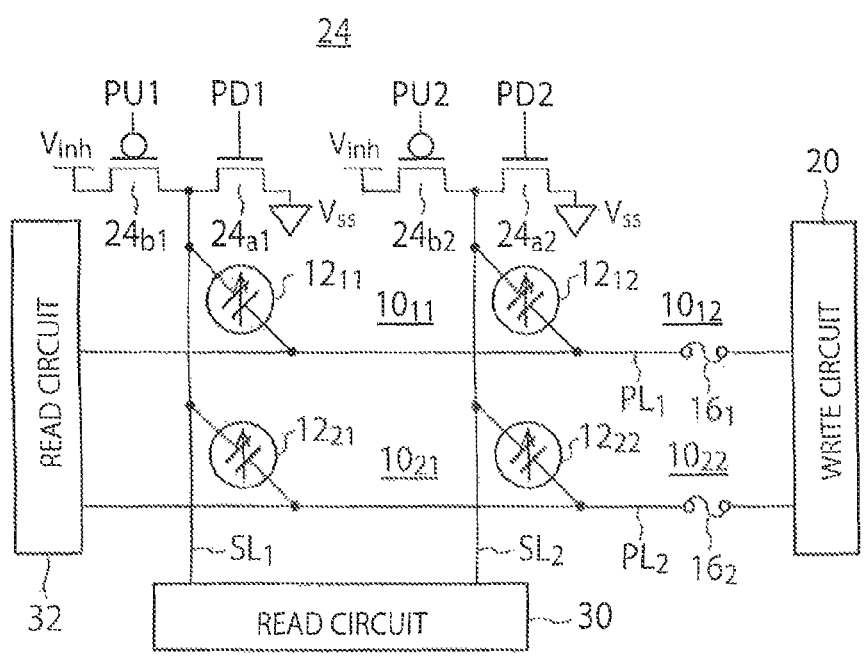
FIG. 10 is a circuit diagram illustrating a programmable logic circuit according to a third embodiment.

FIG. 10 shows a programmable logic circuit according to a third embodiment. The programmable logic circuit according to the third embodiment is obtained by replacing the write circuit 22 with a write circuit 24 in the programmable logic circuit according to the first modification of the first embodiment shown in FIG. 7.

The write circuit 24 includes n-channel MOS transistors $24a_j$ and p-channel MOS transistors $24b_j$ each corresponding to one of the source lines $SL_j$ (j=1, 2). The drain of each transistor $24a_j$ (j=1, 2) connects to the corresponding source line $SL_j$, and the source connects to a power supply supplying a voltage Vss. The drain of each transistor $24b_j$ (j=1, 2) connects to the corresponding source line $SL_j$, and the source connects to a power supply supplying a write inhibiting voltage Vinh.

The programming operation for the programmable logic circuit according to the third embodiment will be described below. For example, if the programmable device $12_{11}$ is to be programmed, a signal PD1 with a voltage value to turn ON the transistor $24a_1$ is applied to the gate of the transistor $24a_1$, a signal PU1 with a voltage value Vinh to turn OFF the transistor $24b_1$ is applied to the gate of the transistor $24b_1$, and a program voltage Vprg is applied to the program line $PL_1$. As a result, a voltage Vprg-Vss is applied to the programmable device $12_{11}$.

The voltage value of the signal PD1 is higher than the threshold voltage. This gate voltage has an effect on the resistance value of the programmable device $12_{11}$ after being programmed. For example, if a voltage value of the signal PD1 is less than Vprg, the transistor $24a_1$ after being programmed operates in a saturation state to curb the current flowing therethrough. As a result, a current with a value similar to that of the current flowing through the transistor $24a_1$ flows through the programmable device $12_{11}$, and the programming of the transistor $24a_1$ is complete. If the voltage value of the signal PD1 is the same as the voltage Vprg, the programmable device $12_{11}$ after being programmed does not curb the current, and has a low resistance value. The resistance value of the programmable device can be controlled in this manner.

The non-selected source line $SL_2$ may be left in a floating state if the voltage value of a signal PD2 to be applied to the gate of the transistor $24a_2$ is the same as the voltage Vss, and the voltage value of a signal PU2 to be applied to the gate of the transistor $24b_2$ is the same as the voltage Vinh to turn OFF both the transistors. Or, the voltage to be applied to the non-selected source line $SL_2$ may be write inhibiting voltage Vinh if the voltage value of a signal PD2 to be applied to the gate of the transistor $24a_2$ is the same as the voltage Vss, and the voltage value of a signal PU2 to be applied to the gate of the transistor $24b_2$ is the same as the voltage Vss. A write inhibiting voltage Vinh or voltage Vss may be applied to the non-selected program line $PL_2$, or the non-selected program line $PL_2$ may be left in a floating state.

The read operation is performed in a similar manner to that for the first modification according to the first embodiment.

In a FPGA, this circuit may be used to switch signals from the other terminals of the source lines SL to the program lines PL by setting the voltage values of the signals PD1, PU1, PD2, and PU2 to turn OFF the transistors. The write inhibiting voltage Vinh is in a range Vprg>Vinh>Vss as described above. If the power supply voltage Vdd for operating the FPGA is used as the voltage Vinh, the number of voltage values is not increased. This may help downsizing the power supply circuit.

As described above, the programmable logic circuit and the nonvolatile FPGA according to the third embodiment are capable of suppressing an increase in area, as in the case of the first modification of the first embodiment.

Fourth Embodiment

Figure 11:
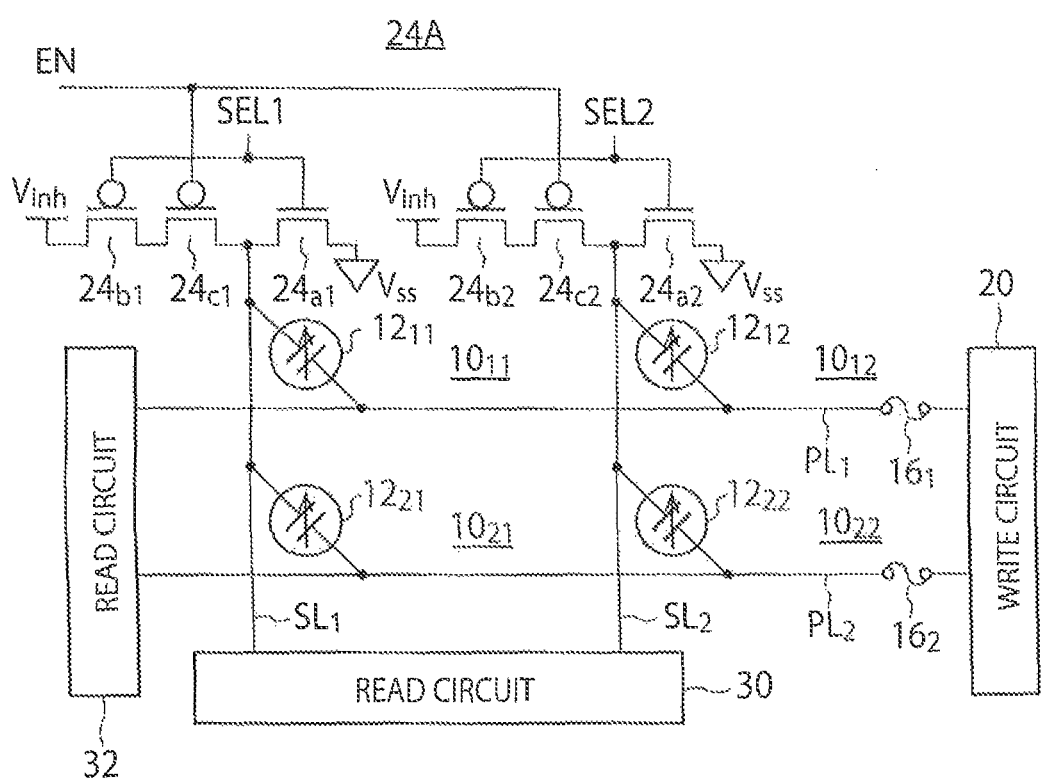
FIG. 11 is a circuit diagram illustrating a programmable logic circuit according to a fourth embodiment.

FIG. 11 shows a programmable logic circuit according to a fourth embodiment. The programmable logic circuit according to the fourth embodiment is obtained by replacing the write circuit 24 with a write circuit 24A in the programmable logic circuit according to the third embodiment shown in FIG. 10.

The write circuit 24A includes a p-channel transistor $24c_j$ disposed between the source line $SL_j$ (j=1, 2) and the p-channel transistor $24b_j$ (j=1, 2) of the write circuit 24. The drain of the transistor $24c_j$ (j=1, 2) connects to the source line $SL_j$, and the source thereof connects to the drain of the transistor $24b_j$. The gates of the transistors $24a_1$, $24b_1$ are connected to a common terminal SEL1, and the gates of the transistors $24a_2$, $24b_2$ are connected to a common terminal SEL2 in the write circuit 24A. The gates of the transistors $24c_1$, $24c_2$ are connected to a common terminal EN. Instead p-channel transistors $24c_j$ (j=1, 2), n-channel transistors may be disposed between the source line $SL_j$ (j=1, 2) and the n-channel transistor $24a_j$ (j=1, 2) of the write circuit 24. In that case, the voltage Vss for terminal EN should be changed to Vinh or Vprg, and the voltage Vinh or Vprg for the terminal EN should be changed to Vss, in the following description.

The programming operation of the fourth embodiment will be described below. For example, if the programmable device $12_{11}$ is to be programmed, a voltage Vss is applied to the terminal EN to turn ON the transistor $24c_1$, a write inhibiting voltage Vinh or program voltage Vprg is applied to the terminal SEL1 to turn ON the transistor $24a_1$, and a voltage Vss is applied to the selected source line $SL_1$. A write voltage Vprg is applied to the selected program line $PL_1$. This allows a voltage Vprg-Vss to be applied across the selected programmable device $12_{11}$.

A voltage Vss is applied to the terminal SEL2 to turn ON the transistor $24b_2$, thereby applying a write inhibiting voltage Vinh to the non-selected source line $SL_2$. This allows a voltage Vprg-Vinh to be applied to the non-selected programmable device $12_{12}$, and thus preventing the programmable device $12_{12}$ from being programmed erroneously. A write inhibiting voltage Vinh or voltage Vss is applied to the non-selected program line $PL_2$, or the non-selected program line $PL_2$ is left to be in a floating state.

In a FPGA, this circuit may be used to switch signals from the read circuit 30 to the program lines PL by turning OFF the transistors $24a_1$, $24c_1$, $24a_2$, $24c_2$ to obtain a high impedance by applying the voltage Vss to the terminals SEL1, SEL2, and a write inhibiting voltage Vinh to the terminal EN. The write inhibiting voltage Vinh is in a range meeting the condition Vprg>Vinh>Vss. If the power supply voltage Vdd for operating the FPGA is used as the write inhibiting voltage Vinh, the number of voltage values need not be increased, and thus the power supply circuit can be downsized. This configuration may increase the number of transistors to be used, but decrease the number of signals to be inputted. Therefore, the area for a considerable number of programmable devices arranged in an array may be reduced.

As described above, the programmable logic circuit and the nonvolatile FPGA according to the fourth embodiment are capable of suppressing an increase in area, as in the case of the first modification of the first embodiment.

Fifth Embodiment

Figure 12:
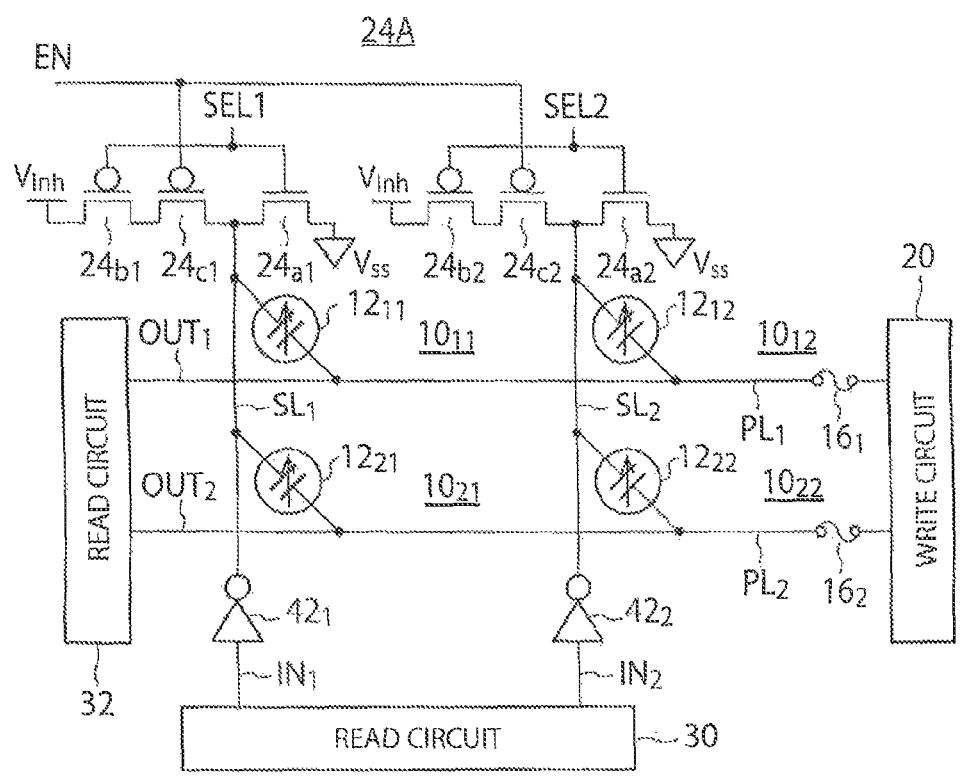
FIG. 12 is a circuit diagram illustrating a programmable logic circuit according to a fifth embodiment.

FIG. 12 shows a programmable logic circuit according to a fifth embodiment. The programmable logic circuit according to the fifth embodiment includes inverter circuits $42_1$, $42_2$ disposed between the read circuit 30 and the source line $SL_1$, and the read circuit 30 and the source line $SL_2$, respectively, in the programmable logic circuit according to the fourth embodiment shown in FIG. 11. The inverter circuits $42_1$, $42_2$ may be CMOS inverters or any other inverters.

An increase in the size of the array of programmable devices or the number of signal switching circuits connecting to the array may increase the resistance and the capacitance of the programmable device after being programmed. This may lead to degradation of the rising waveform and the falling waveform of logic signals, and increase power consumption.

The inverter circuits $42_1$, $42_2$ disposed between the read circuit 30 and the source line $SL_1$, and the read circuit 30 and the source line $SL_2$, respectively in the fifth embodiment may amplify output signals IN1, IN2 from the read circuit 30 to the source lines $SL_1$, $SL_2$, and prevent the degradation of the rising waveform and the falling waveform of logic signals to suppress the increase in power consumption.

Figure 13:
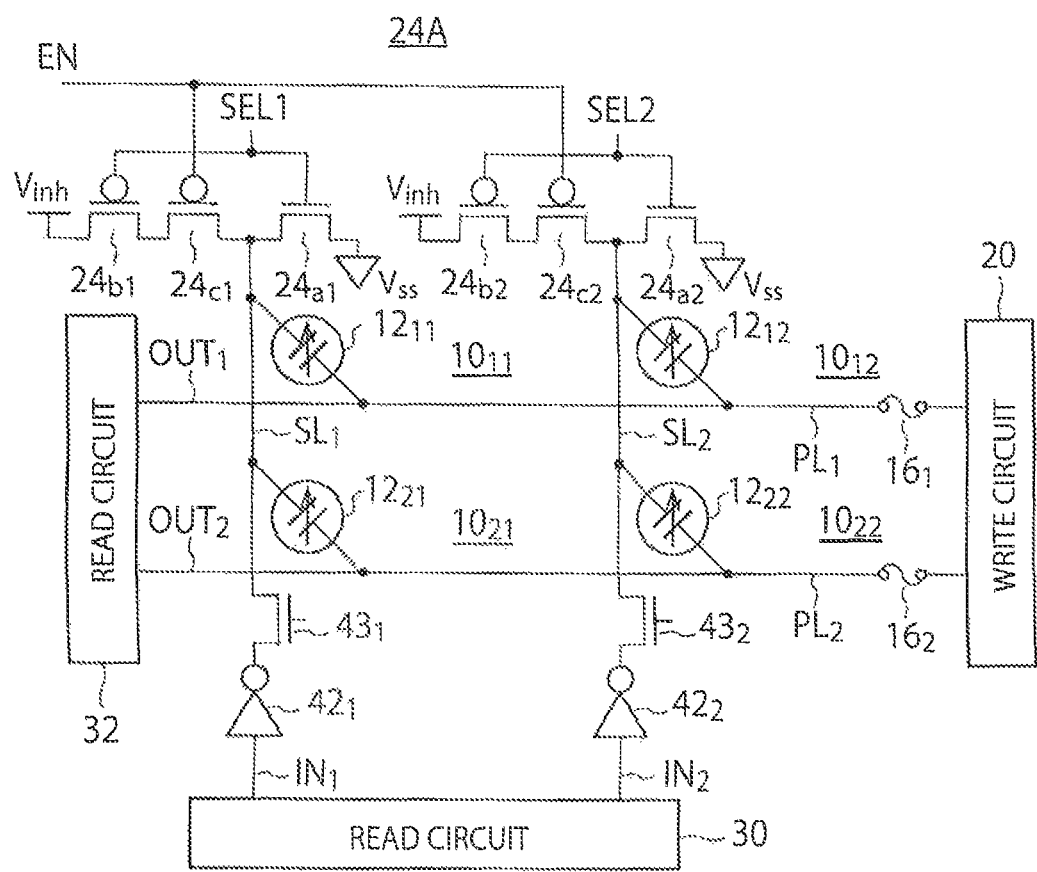
FIG. 13 is a circuit diagram illustrating a programmable logic circuit according to a modification of the fifth embodiment.

If the program voltage Vprg used to program the programmable device may cause damage to the transistors included in the inverter circuits $42_1$, $42_2$, protection transistors $43_1$, $43_2$ may be disposed between the outputs of the inverter circuits $42_1$, $42_2$ and the source lines $SL_1$, $SL_2$ as shown in FIG. 13 to protect the inverter circuits $42_1$, $42_2$. Further, write circuit 24A may be considered as CMOS inverter composed of transistor $24a_j$ and $24b_j$ when voltage Vss is applied to the terminal EN. Therefore, the write circuit 24A is also used as the inverter circuits $42_j$ (j=1, 2). The terminals SEL1 and SEL2 are also used as the terminals IN1 and IN2. The read circuit 30 includes the function to pull-up and pull-down the terminals IN1 and IN2 for programming. In that case, the circuit can be reduced in area since the inverter circuits $42_j$ are included in the write circuit 24A.

As described above, the programmable logic circuit and the nonvolatile FPGA according to the fifth embodiment are capable of suppressing an increase in area, as in the case of the first modification of the first embodiment.

Sixth Embodiment

Figure 14:
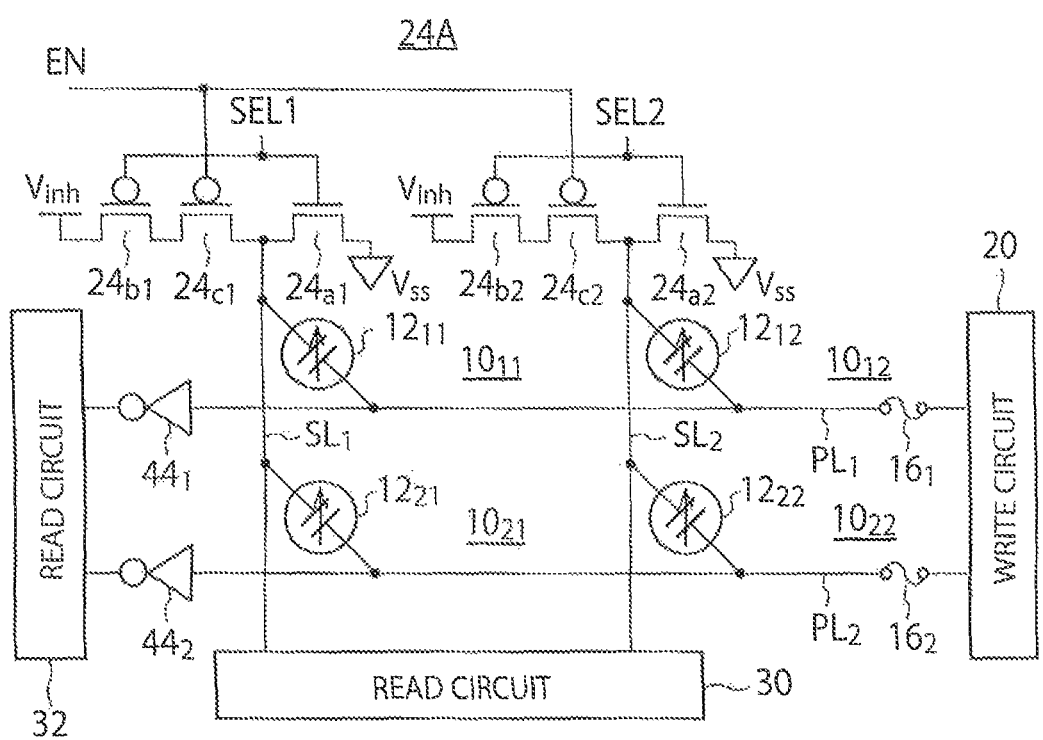
FIG. 14 is a circuit diagram illustrating a programmable logic circuit according to a sixth embodiment.

FIG. 14 shows a programmable logic circuit according to a sixth embodiment. The programmable logic circuit according to the sixth embodiment includes inverter circuits $44_1$, $44_2$ disposed between the read circuit 32 and the program line $PL_1$, and the read circuit 32 and the program line $PL_2$, respectively, in the programmable logic circuit according to the fourth embodiment shown in FIG. 11. The inverter circuits $44_1$, $44_2$ may be CMOS inverters or any other inverters.

With such a configuration, the degradation of the rising waveform and the falling waveform of logic signals may be prevented as in the case of the fifth embodiment.

Figure 15:
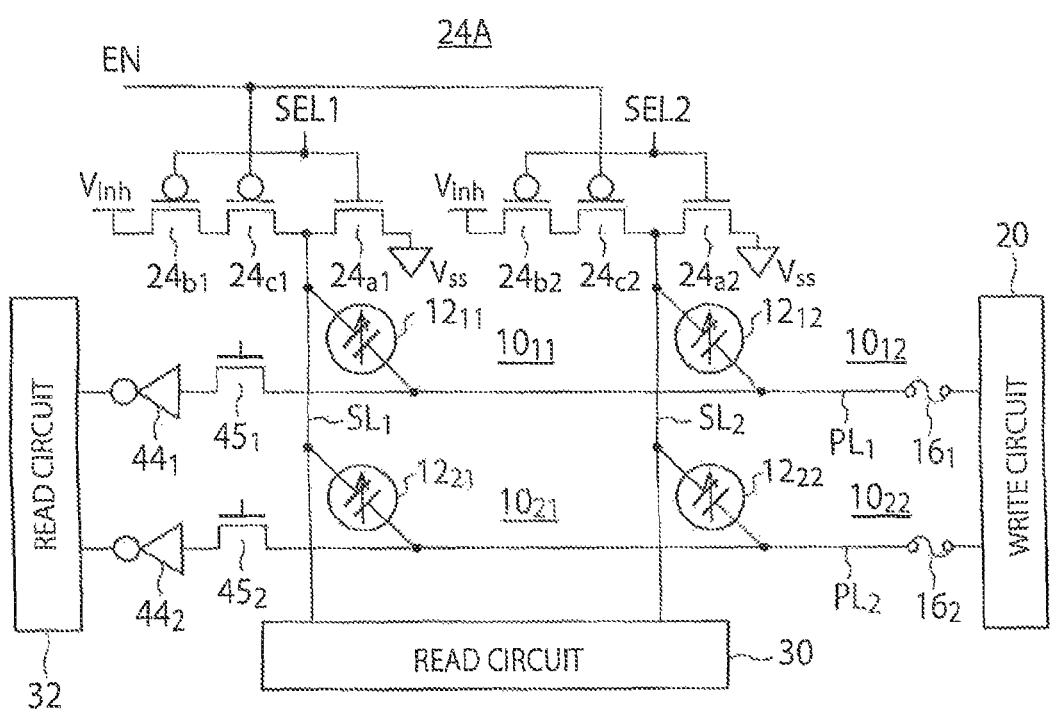
FIG. 15 is a circuit diagram showing a programmable logic circuit according to a modification of a sixth embodiment.

If the program voltage Vprg used to program the programmable device may cause damage to the transistors included in the inverter circuits $44_1$, $44_2$, protection transistors $45_1$, $45_2$ may be disposed between the inputs of the inverter circuits $44_1$, $44_2$ and the program lines PL1, PL2 as shown in FIG. 15 to protect the inverter circuits $44_1$, $44_2$.

As described above, the programmable logic circuit and the nonvolatile FPGA according to the sixth embodiment are capable of suppressing an increase in area, as in the case of the first modification of the first embodiment.

Seventh Embodiment

Figure 16:
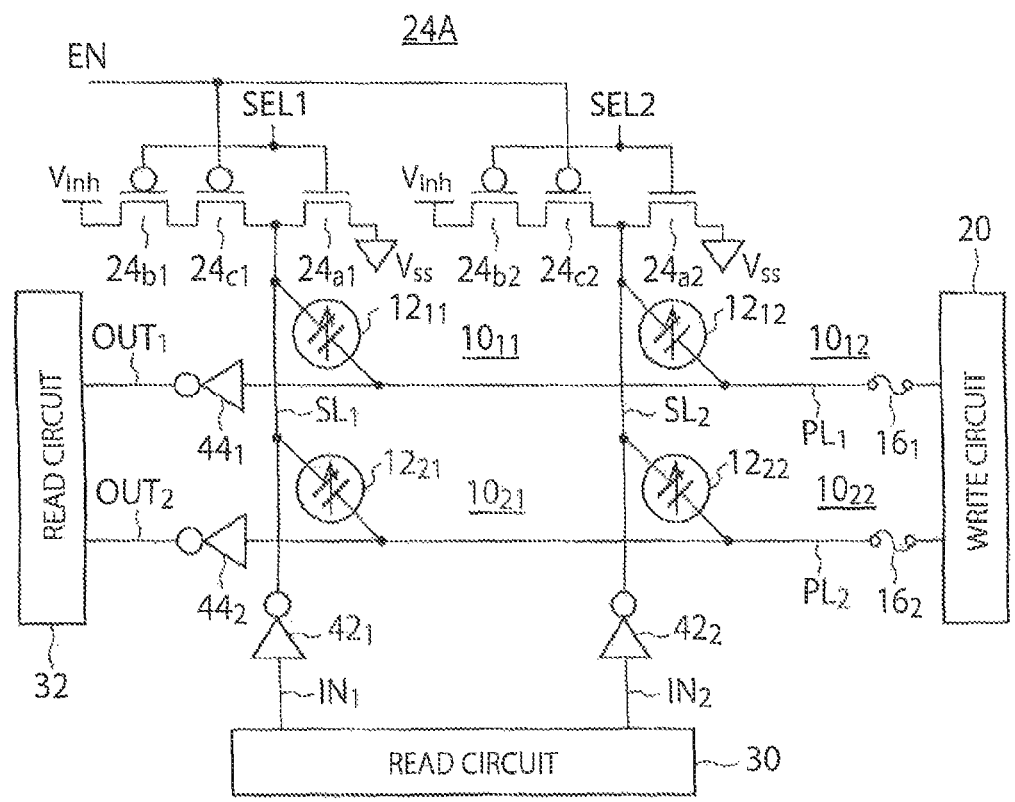
FIG. 16 is a circuit diagram illustrating a programmable logic circuit according to a seventh embodiment.

FIG. 16 shows a programmable logic circuit according to a seventh embodiment. The programmable logic circuit according to the seventh embodiment includes inverter circuits $44_1$, $44_2$ disposed between the read circuit 32 and the program line $PL_1$, and the read circuit 32 and the program line $PL_2$, respectively, in the programmable logic circuit according to the fifth embodiment shown in FIG. 12. The inverter circuits $44_1$, $44_2$ may be CMOS inverters or any other inverters.

With such a configuration, the degradation of the rising waveform and the falling waveform of logic signals may be prevented as in the case of the fifth embodiment. Since the inverter circuits $42_1$, $42_2$, $44_1$, $44_2$ are connected to both the sources lines $SL_1$, $SL_2$ to which signals are inputted and the program lines $PL_1$, $PL_2$ from which signals are outputted, the degrees of the amplification of signals are increased, which causes the programmable logic circuit to operate faster. There is a possibility that the logic may be inverted through the signal switching circuit in the fifth or sixth embodiment shown in FIG. 12 or 14, since only one inverter circuit is present in each signal path. The two inverter circuits disposed on each signal path in the six embodiment may prevent the Inversion of logic through the signal switching circuit.

If the program voltage Vprg used to program the programmable device may cause damage to the transistors included in the inverter circuits, protection transistors may be disposed between the source lines $SL_1$, $SL_2$ and the inverter circuits $42_1$, $42_2$, or between the program lines $PL_1$, $PL_2$ and the inverters circuit $44_1$, $44_2$ as shown in FIG. 13 or 15 to protect the inverter circuits.

As described above, the programmable logic circuit and the nonvolatile FPGA according to the seventh embodiment are capable of suppressing an increase in area, as in the case of the first modification of the first embodiment.

Eighth Embodiment

Figure 17:
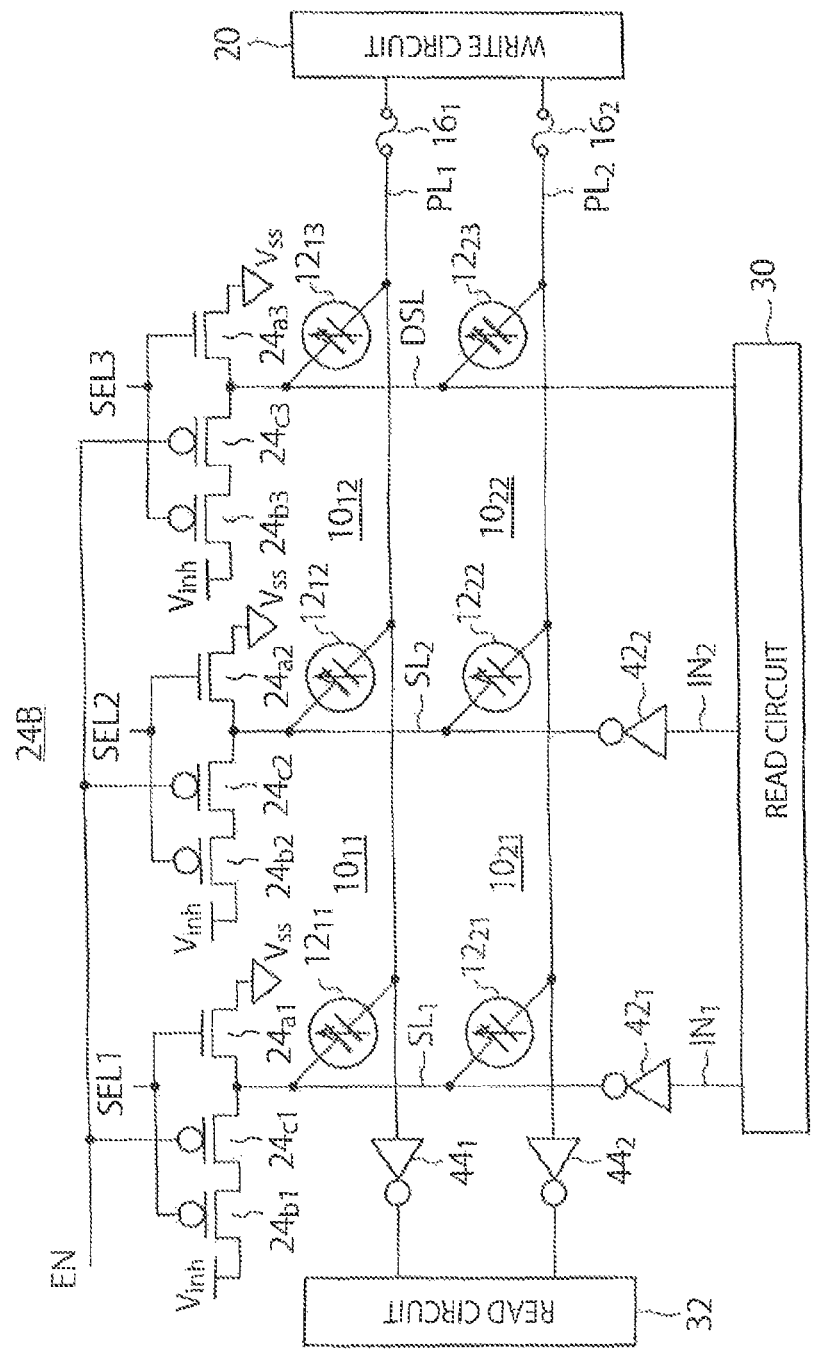
FIG. 17 is a circuit diagram illustrating a programmable logic circuit according to an eighth embodiment.

FIG. 17 shows a programmable logic circuit according to an eighth embodiment. The programmable logic circuit according to the eighth embodiment is obtained by replacing the write circuit 24A with a write circuit 24B and adding a dummy wiring line DSL and programmable devices $12_{13}$, $12_{23}$ to the programmable logic circuit according to the seventh embodiment shown in FIG. 16. Each programmable device $12_{i3}$ (i=1, 2) includes a first terminal connecting to the dummy wiring line DSL, and a second terminal connecting to a corresponding program line $PL_i$.

The write circuit 24B is obtained by adding to the write circuit 24A shown in FIG. 16 an n-channel transistor $24a_3$, a p-channel transistor $24c_3$, and a p-channel transistor $24b_3$ that are connected in series. The source of the transistor $24a_3$ is connected to a power supply generating a voltage Vss, the drain is connected to one terminal of the dummy wiring line DSL, and the gate is connected to a terminal SEL3. The drain of the transistor $24c_3$ is connected to the dummy wiring line DSL, the source is connected to the drain of the transistor $24b_3$, and the gate is connected to a terminal EN. The source of the transistor $24b_3$ is connected to a power supply generating a write inhibiting voltage Vinh, and the gate is connected to the terminal SEL3. The other terminal of the dummy wiring line DSL may or may not be connected to the read circuit 30.

If none of the programmable devices connected to one fuse element is programmed in the seventh embodiment shown in FIG. 16, the fuse element is kept electrically conductive. As a result, the write circuit 20 and the read circuit 32 are kept connected to each other while the FPGA is operating. This may cause a malfunction or an increase in power consumption. This may not be a problem if all the fuse elements are to be programmed. If not, this problem may be avoided by the dummy wiring line DSL serving as a source line as in the eighth embodiment shown in FIG. 17.

If neither the programmable device $12_{11}$ nor the programmable device $12_{12}$ is to be programmed in the eighth embodiment, the programming of the programmable device $12_{13}$ can make the fuse element $16_1$ nonconductive. The dummy wiring line DSL is not used as a signal path in an FPGA, and thus does not need to be connected to any element. However, a dummy wiring line DSL being left to be in a floating state may have an intermediate voltage, which may increase the leakage current of the inverter circuits $44_1$, $44_2$. In order to prevent this, the dummy wiring line DSL may be connected to a constant voltage such as the voltage Vss or the power supply voltage Vdd. For example, while the FPGA is operating, the write inhibiting voltage Vinh may be applied to the terminal SEL3, and the voltage VSS may be applied to the dummy wiring line DSL.

The programmable logic circuit and the nonvolatile FPGA according to the eighth embodiment are capable of suppressing an increase in area, as in the case of the seventh embodiment.

Ninth Embodiment

A programmable logic circuit according to a ninth embodiment will be described with reference to FIG. 18. The programmable logic circuit according to the ninth embodiment is obtained by employing a programmable device 12A shown in FIG. 18 in any of the programmable logic circuits according to the first embodiment to the eighth embodiment.

Figure 18:
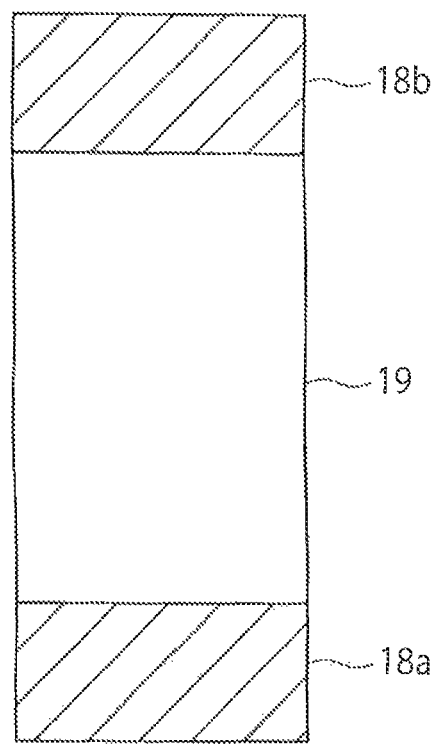
FIG. 18 is a cross-sectional view illustrating a programmable device in a programmable logic circuit according to a ninth embodiment.

The programmable device 12A shown in FIG. 18 is a variable resistance nonvolatile memory including a first electrode 18a and a second electrode 18b, each including one or more layers, and a variable resistance film 19 disposed between the first electrode 18a and the second electrode 18b. The resistance value of the variable resistance film 19 changes to a high resistance, a low resistance, or an intermediate resistance depending on the magnitude, the direction, and the application time of a voltage applied between the second electrode 18b and the first electrode 18a. Generally, a high voltage is applied to a variable resistance film of a resistive change memory to introduce defects (filament) to make it become a variable resistance insulating film. In the voltage Vprg is employed as the initial voltage (forming voltage) of the above operation to introduce defects, the above operation corresponds to the programming operation for the programmable device according to the first embodiment to the eighth embodiment. Therefore, a resistive change memory can be used as the programmable device of the programmable logic circuit according to any of the first to the eighth embodiments. Similarly, if a resistive change memory, the resistance of which may be switched between a high resistance and a low resistance by a current, is used as a fuse element of the programmable device, the fuse element can be programmed to be in a low resistance state if it is used in a programming operation, and a high resistance state if it is used in an FPGA. The resistive change programmable device to be programmed and the resistive change fuse element are arranged so that the high-resistance state and the low-resistance state thereof are opposite to each other. Since the resistive change memory used as the programmable device or fuse element becomes a nonvolatile memory after defects are introduced thereto, the FPGA can be rewritten repeatedly.

The programmable logic circuit and the nonvolatile FPGA according to the ninth embodiment are capable of suppressing an increase in area, as in the case of the first to the eighth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the Inventions. The accompanying claims and their equivalents are intended to cover such forms or modifications as would fall within the scope and spirit of the inventions.

The invention claimed is:

1. A programmable logic circuit comprising:
a first programmable device with a first terminal and a second terminal, a resistance of the first programmable device being changeable from a high resistance to a low resistance;
a second programmable device with a third terminal and a fourth terminal, a resistance of the second programmable device being changeable from a high resistance to a low resistance;
a first wiring line to which the first terminal of the first programmable device is connected;
a second wiring line to which the third terminal of the second programmable device is connected;
a third wiring line to which the second terminal of the first programmable device and the fourth terminal of the second programmable device are connected; and
a fuse element of which one terminal is connected to the third wiring line,
wherein each programmable device is a MOS transistor including a source, a drain and a gate, each of the first and third terminals is one of the source and the drain, and each of the second and fourth terminals is the gate.

2. The logic circuit according to claim 1, wherein one of the first and second programmable devices changes from the high resistance to the low resistance and the other does not change.

3. A nonvolatile FPGA comprising a plurality of block units, each block unit including a logic block, and a switch block connected to the logic block, the logic block performing a logical operation, the switch block controlling a connection or disconnection between the block units, at least one of the logic block and the switch block including the logic circuit according to claim 1.

4. The logic circuit according to claim 1, wherein a resistance change between the first and second terminals and a resistance change between the third and fourth terminals are irreversible.

5. A programmable logic circuit, comprising:
a first programmable device with a first terminal and a second terminal, a resistance of the first programmable device being changeable from a high resistance to a low resistance;
a second programmable device with a third terminal and a fourth terminal, a resistance of the second programmable device being changeable from a high resistance to a low resistance;
a first wiring line to which the first terminal of the first programmable device is connected;
a second wiring line to which the third terminal of the second programmable device is connected;
a third wiring line to which the second terminal of the first programmable device and the fourth terminal of the second programmable device are connected; and
a fuse element of which one terminal is connected to the third wiring line,
wherein each programmable device is a MOS transistor in which a source and a drain are connected to each other, the source of the first programmable device is one of the first terminal and the second terminal, a gate of the first programmable device is the other, the source of the second programmable device is one of the third terminal and the fourth terminal, and a gate of the second programmable device is the other.

6. A programmable logic circuit comprising:
a plurality of cells arranged in a matrix form with rows and columns, each cell including a programmable device with a first terminal and a second terminal, a resistance of the programmable device being changeable from a high resistance to a low resistance;
a plurality of first wiring lines each corresponding to one of the columns of the cells, and being connected to the first terminals of the programmable devices of the cells in the corresponding one of the columns;
a plurality of second wiring lines each corresponding to one of the rows of the cells, and being connected to the second terminals of the programmable devices of the cells in the corresponding one of the rows;
a plurality of fuse elements each corresponding to one of the second wiring lines, one terminal of each fuse element being connected to the corresponding one of the second wiring lines; and
a write circuit configured to select a first wiring line among the plurality of first wiring lines and to select a second wiring line among the plurality of second wiring lines, and to apply a first voltage to the selected first wiring line and a second voltage to the selected second wiring line.

7. The logic circuit according to claim 6, further comprising a plurality of first transistors each corresponding to one of the first wiring lines, one of a source and a drain of each first transistor being connected to the corresponding one of the first wiring lines, and the other being connected to the write circuit.

8. The logic circuit according to claim 6, wherein the write circuit includes an n-channel first transistor and a p-channel second transistor connected in series, the n-channel first transistor and the p-channel second transistor corresponding to one of the first wiring lines, one of a source and a drain of each n-channel first transistor being connected to the corresponding one of the first wiring lines, and one of a source and a drain of each p-channel second transistor being connected to the corresponding one of the first wiring lines.

9. The logic circuit according to claim 6, wherein the write circuit includes a plurality of write units each including an n-channel first transistor, a p-channel second transistor, and a p-channel third transistor connected in series and corresponding to one of the first wiring lines, one of a source and a drain of the n-channel first transistor in each write unit being connected to the corresponding one of the first wiring lines, one of a source and a drain of the p-channel second transistor connected to the corresponding one of the first wiring lines, and one of source and a drain of the p-channel third transistor connected to the other of the source and the drain of the p-channel second transistor.

10. The logic circuit according to claim 9, wherein a first signal is inputted to gates of the n-channel first transistor and the p-channel third transistor in each write unit, and a second signal is inputted to a gate of the second transistor.

11. The logic circuit according to claim 6, further comprising a plurality of first inverter circuits each corresponding to one of the first wiring lines, and being connected to the corresponding one of the first wiring lines.

12. The logic circuit according to claim 11, further comprising a plurality of fourth transistor each corresponding to one of the first wiring lines, one of a source and a drain of each fourth transistor being connected to an output terminal of a corresponding one of the first inverter circuits, and the other being connected to the corresponding one of the first wiring lines.

13. The logic circuit according to claim 6, further comprising a plurality of second inverter circuits each corresponding to one of the second wiring lines, an input terminal of each second inverter circuit being connected to the corresponding one of the second wiring lines.

14. The logic circuit according to claim 13, further comprising a plurality of fifth transistors each corresponding to one of the second wiring lines, one of a source and a drain of each fifth transistor being connected to an input terminal of a corresponding one of the second inverter circuits, and the other being connected to the corresponding one of the second wiring lines.

15. The logic circuit according to claim 6, further comprising:
a plurality of dummy cells arranged in a column direction, each corresponding to one of the second wiring lines and including a dummy programmable device with a third terminal and a fourth terminal, the fourth terminal being connected to the corresponding one of the second wiring lines, a resistance of the dummy programmable device being changeable from a high resistance to a low resistance; and
a dummy wiring line extending in the column direction, to which the third terminal of the dummy programmable device in each dummy cell is connected.

16. The logic circuit according to claim 15, further comprising:
a dummy write unit corresponding to the dummy wiring line and including an n-channel sixth transistor, a p-channel seventh transistor, and a p-channel eighth transistor connected in series, one of a source and a drain of the n-channel sixth transistor being connected to the dummy wiring line, one of a source and a drain of the p-channel seventh transistor being connected to the dummy wiring line, and one of a source and a drain of the p-channel eighth transistor being connected to the other of the source and the drain of the p-channel seventh transistor.

17. The logic circuit according to claim 15, wherein each dummy programmable device is a MOS transistor of which a source and a drain is connected to each other, the source is one of the third terminal and the fourth terminal, and a gate is the other.

18. The logic circuit according to claim 15, wherein each programmable device is a MOS transistor including a source, a drain and a gate, the first terminal is one of the source and the drain and the second terminal is the gate.

19. The logic circuit according to claim 6, wherein each programmable device is a MOS transistor of which a source and a drain is connected to each other, the source is one of the first terminal and the second terminal, and a gate is the other.

20. The logic circuit according to claim 6, wherein each programmable device is a MOS transistor including a source, a drain and a gate, the first terminal is one of the source and the drain and the second terminal is the gate.

21. A nonvolatile FPGA comprising a plurality of block units, each block unit including a logic block, and a switch block connected to the logic block, the logic block performing a logical operation, the switch block controlling a connection or disconnection between the block units, at least one of the logic block and the switch block including the logic circuit according to claim 6.

* * * * *